(12) United States Patent
Rho et al.

(10) Patent No.: US 9,024,289 B2
(45) Date of Patent: May 5, 2015

(54) VERTICAL TYPE SEMICONDUCTOR MEMORY APPARATUS AND FABRICATION METHOD THEREOF

(71) Applicant: SK Hynix Inc., Gyeonggi-do (KR)

(72) Inventors: Dae Ho Rho, Gyeonggi-do (KR); Jeong Tae Kim, Gyeonggi-do (KR); Hyun Kyu Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/050,037

(22) Filed: Oct. 9, 2013

(65) Prior Publication Data

US 2014/0374692 A1      Dec. 25, 2014

(30) Foreign Application Priority Data

Jun. 21, 2013 (KR) .................. 10-2013-0071498

(51) Int. Cl.
| | |
|---|---|
| *H01L 29/06* | (2006.01) |
| *H01L 27/24* | (2006.01) |
| *H01L 45/00* | (2006.01) |

(52) U.S. Cl.
CPC ........ *H01L 27/2481* (2013.01); *H01L 45/1683* (2013.01)

(58) Field of Classification Search
CPC .............................. H01L 21/28; H01L 29/788
USPC ......... 257/315, 324, E29.3, E29.19; 438/591, 438/593
See application file for complete search history.

(56) References Cited

U.S. PATENT DOCUMENTS

| | | | | |
|---|---|---|---|---|
| 5,909,059 | A * | 6/1999 | Hada et al. ............... | 257/750 |
| 6,943,400 | B2 * | 9/2005 | Manabe ................... | 257/314 |
| 6,953,960 | B2 * | 10/2005 | Tomishima .............. | 257/300 |
| 7,875,922 | B2 * | 1/2011 | Arai et al. ................ | 257/316 |
| 7,915,113 | B2 * | 3/2011 | Kim et al. ................ | 438/206 |
| 7,952,136 | B2 * | 5/2011 | Kito et al. ................ | 257/326 |
| 8,013,383 | B2 * | 9/2011 | Kidoh et al. ............. | 257/324 |
| 8,148,216 | B2 * | 4/2012 | Arai et al. ................ | 438/152 |
| 8,174,065 | B2 * | 5/2012 | Kim et al. ................ | 257/330 |
| 8,198,669 | B2 * | 6/2012 | Omura .................... | 257/324 |
| 8,278,695 | B2 * | 10/2012 | Kidoh et al. ............. | 257/314 |
| 8,288,816 | B2 * | 10/2012 | Komori et al. ........... | 257/324 |
| 8,405,141 | B2 * | 3/2013 | Matsuda et al. .......... | 257/324 |
| 8,426,908 | B2 * | 4/2013 | Higashi ................... | 257/324 |
| 8,470,668 | B2 * | 6/2013 | Cho et al. ................ | 438/243 |
| 8,551,838 | B2 * | 10/2013 | Kito et al. ................ | 438/257 |
| 8,581,323 | B2 * | 11/2013 | Uenaka et al. ........... | 257/316 |
| 8,633,104 | B2 * | 1/2014 | Pyo et al. ................. | 438/618 |
| 8,786,003 | B2 * | 7/2014 | Iwase et al. .............. | 257/316 |
| 2006/0076611 | A1 * | 4/2006 | Matsui et al. ............ | 257/316 |
| 2007/0152255 | A1 * | 7/2007 | Seo et al. ................. | 257/302 |

(Continued)

FOREIGN PATENT DOCUMENTS

| | | |
|---|---|---|
| KR | 1020090039202 | 4/2009 |
| KR | 101194916 | 10/2012 |

*Primary Examiner* — Caleb Henry
(74) *Attorney, Agent, or Firm* — IP & T Group LLP

(57) ABSTRACT

Semiconductor memory apparatus and a method of fabricating the same are provided. The semiconductor memory apparatus includes a semiconductor substrate in which a cell area and a peripheral area are defined, a plurality of pillars formed in the a cell area of the semiconductor substrate to a first depth, a stepped part formed in the peripheral area to a height corresponding to the first depth, a recessed part formed in the stepped part to a second depth, and a core switching device formed in the recessed part.

10 Claims, 8 Drawing Sheets

(56) References Cited

U.S. PATENT DOCUMENTS

| | | | |
|---|---|---|---|
| 2008/0099819 A1* | 5/2008 | Kito et al. | 257/315 |
| 2008/0173928 A1* | 7/2008 | Arai et al. | 257/316 |
| 2009/0101970 A1* | 4/2009 | Kim et al. | 257/330 |
| 2009/0212350 A1* | 8/2009 | Kidoh et al. | 257/324 |
| 2009/0224309 A1* | 9/2009 | Kidoh et al. | 257/326 |
| 2009/0267135 A1* | 10/2009 | Tanaka et al. | 257/324 |
| 2009/0310425 A1* | 12/2009 | Sim et al. | 365/185.29 |
| 2010/0176440 A1* | 7/2010 | Omura | 257/324 |
| 2010/0254191 A1* | 10/2010 | Son et al. | 365/185.05 |
| 2010/0327339 A1* | 12/2010 | Tanaka et al. | 257/324 |
| 2011/0019480 A1* | 1/2011 | Kito et al. | 365/185.18 |
| 2011/0031547 A1* | 2/2011 | Watanabe | 257/319 |
| 2011/0115014 A1* | 5/2011 | Ichinose et al. | 257/324 |
| 2011/0306204 A1* | 12/2011 | Bai et al. | 438/655 |
| 2012/0061744 A1* | 3/2012 | Hwang et al. | 257/324 |
| 2012/0108048 A1* | 5/2012 | Lim et al. | 438/586 |
| 2012/0175734 A1* | 7/2012 | Sohn | 257/532 |
| 2012/0208347 A1* | 8/2012 | Hwang et al. | 438/430 |
| 2013/0113033 A1* | 5/2013 | Choi et al. | 257/324 |
| 2013/0193549 A1* | 8/2013 | Lee | 257/508 |
| 2013/0196477 A1* | 8/2013 | Kang | 438/270 |
| 2013/0240971 A1* | 9/2013 | Takekida et al. | 257/316 |
| 2013/0292758 A1* | 11/2013 | Oota et al. | 257/324 |

* cited by examiner

VERTICAL TYPE SEMICONDUCTOR MEMORY APPARATUS AND FABRICATION METHOD THEREOF

CROSS-REFERENCES TO RELATED APPLICATION

The present application claims priority under 35 U.S.C. 119(a) to Korean application number 10-2013-0071498, filed on Jun. 21, 2013, in the Korean Intellectual Property Office, which is incorporated herein by reference in its entirety.

BACKGROUND

1. Technical Field

Various embodiments of the inventive concept relate to a semiconductor integrated circuit, and more particularly, to a semiconductor memory apparatus and a fabrication method thereof.

2. Related Art

With miniaturization of digital apparatuses, high integration and miniaturization of semiconductor memory apparatuses are required. In particular, portable digital apparatuses have been increasingly distributed, and ultra-high integration, ultra-high speed, and ultra-low power of semiconductor memory apparatuses embedded in a limited size are required to process data in the limited size with higher speed.

To meet this demand, studies on vertical memory devices have been actively made.

FIG. 1 is a cross-sectional view illustrating a structure of a general vertical memory apparatus.

Referring to FIG. 1, a semiconductor substrate 101 in which a cell area C and a peripheral area P are defined by a device isolation layer 103 is provided.

A vertical memory device may be formed in the cell area C. For example, a cell switching device SW_C including a pillar 201 protruding perpendicular to a surface of the semiconductor substrate 101, and a gate insulating layer 203 and a gate conductive layer 205 surrounding a circumference of the pillar 201 are formed. A lower electrode 209 and a data storage unit 211 are formed to extend from an upper surface of the pillar 201 to a protrusion direction of the pillar 201. The data storage unit 211 may be formed using a material of which a resistance value is to be switched according to a voltage or a current supplied to the data storage unit 211. An upper electrode 213 is formed on an upper surface of the data storage unit 211. The upper electrode 213 may be coupled to a conductive line (not shown) through a metal contact 215. A metal silicide layer 207 may be additionally formed to improve between an interface resistance between the cell switching device SW_C and the lower electrode 209.

A core switching device SW_P may be formed in the peripheral area P.

The core switching device SW_P may have a structure in which a sidewall of each of a plurality of conductive stacks is surrounded by a gate insulating layer, and a hard mask 303 configured to protect the conductive stacks is formed on the core switching device SW_P. The core switching device SW_P may be coupled to an interconnection layer 307 through a junction contact 305, and the interconnection layer 307 may be coupled to each of conductive lines (not shown) through a metal contact 309.

The reference numerals 105, 107, and 109 denote interlayer insulating layers.

It may be seen from FIG. 1 that the vertical cell switching device SW_C formed in the cell area C may be formed by allowing the substrate to be recessed to a predetermined depth, forming the pillar 201, and forming a gate conductive layer 205 to surround the circumference of the pillar 201.

When the pillar 201 is formed in the cell area C, the peripheral area P is not recessed and an initial height of the peripheral area P is kept as it is. Thus, a height of an upper surface 1018 of the semiconductor substrate 101 in the peripheral area P may be higher than a height of an upper surface 101A of the semiconductor substrate 101 in the cell area C.

When the semiconductor device is fabricated on the stepped semiconductor substrate, a height of the memory device formed in the cell area C is determined according to a height of the core switching device SW_P formed in the peripheral area P.

The core switching device SW_P is formed high in a multi-layered structure. The cell switching device SW_C is formed in the cell area C, and the core switching device SW_P is formed in the peripheral area P that is higher than the cell area C. Then, the interlayer insulating layer 107 is formed in the semiconductor substrate including the core switching device SW_P and a planarization process is performed on the interlayer insulating layer. However, since the core switching device SW_P is previously formed higher than an upper surface of the cell area C, it is difficult to precisely control the planarization process due to a large difference of height between the cell area C and the peripheral area P.

To form the lower electrode 209, a lower electrode contact hole is formed by patterning the interlayer insulating layer 107 formed in the cell area C. However, since a height of the interlayer insulating layer 107 depends on the height of the core switching device SW_P, an etching process of forming the lower electrode contact hole having a large aspect ratio is required. Further, since a process of gap-filling a lower electrode material in the lower electrode contact hole having the large aspect ratio is necessary, a level of difficulty in the process is increased and it is difficult to ensure yield.

Further, since a height of the lower electrode 209 formed in the cell area C depends on the height of the core switching device SW_P, there is a limitation in miniaturization of the semiconductor memory device.

SUMMARY

According to an aspect of an exemplary embodiment of the present invention, there is provided a semiconductor memory apparatus. The semiconductor memory apparatus may include a semiconductor substrate in which a cell area and a peripheral area are defined, a plurality of pillars formed in the cell area of the semiconductor substrate to a first depth, a stepped part formed in the peripheral area to a height substantially the same as the first depth, a recessed part formed in the stepped part to a second depth, and a core switching device formed in the recessed part.

According to an aspect of another exemplary embodiment of the present invention, there is provided a method of fabricating a semiconductor memory apparatus. The method of fabricating a semiconductor memory apparatus may include defining a cell area and a peripheral area in a semiconductor substrate, forming a plurality of pillars in the cell area by recessing a predetermined portion of the semiconductor substrate in the cell area to a first depth, forming a recessed part in the peripheral area by recessing a predetermined portion of the semiconductor substrate in the peripheral area to a second depth, and forming a core switching device in the recessed part.

These and other features, aspects and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
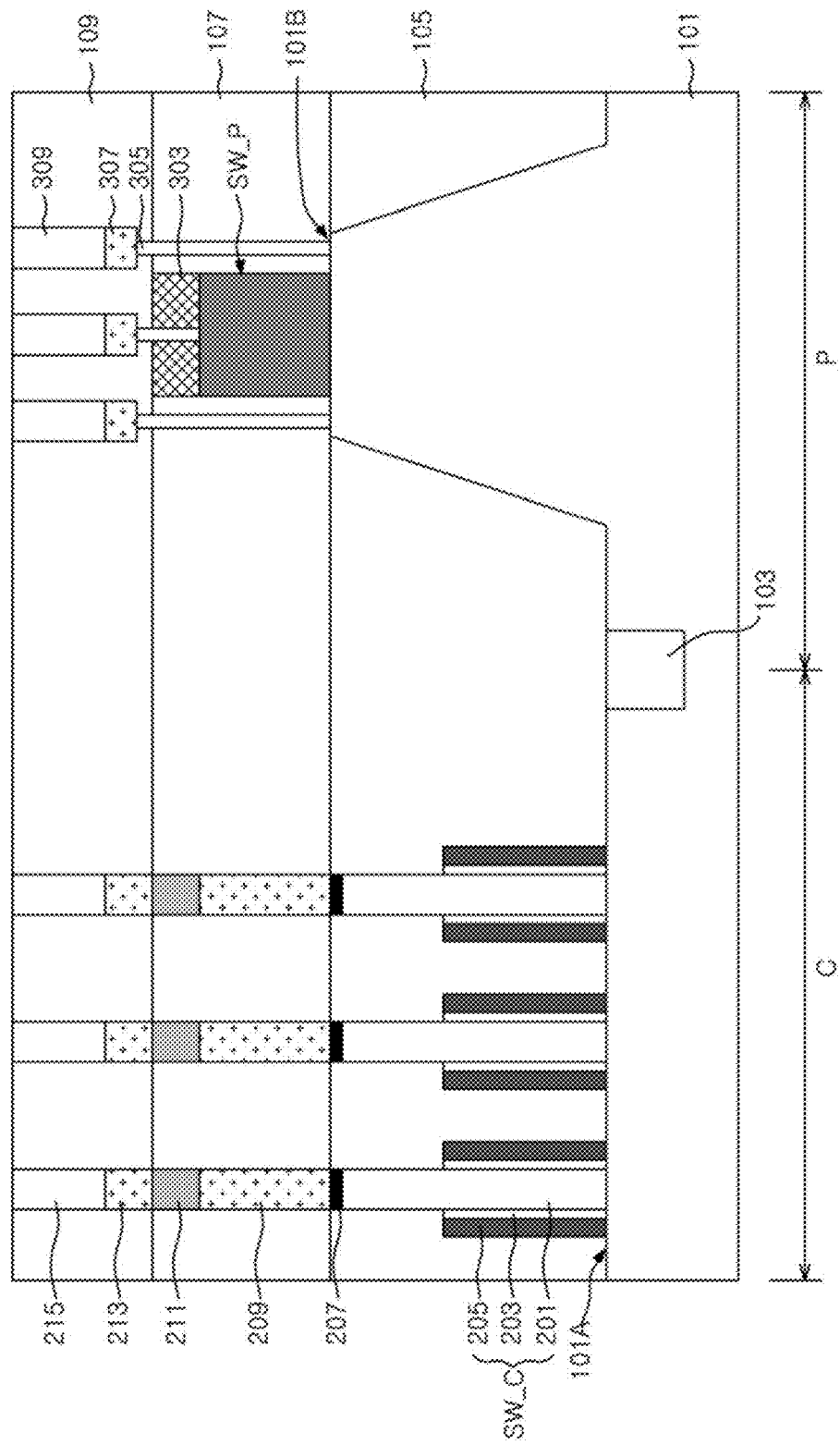
FIG. 1 is a cross-sectional view illustrating a structure of a general vertical memory apparatus.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also understood that in this specification, "connected/coupled" refers to one component not only directly coupling another component but also indirectly coupling another component through an intermediate component. In addition, a singular form may include a plural form as long as it is not specifically mentioned in a sentence.

Figure 2:
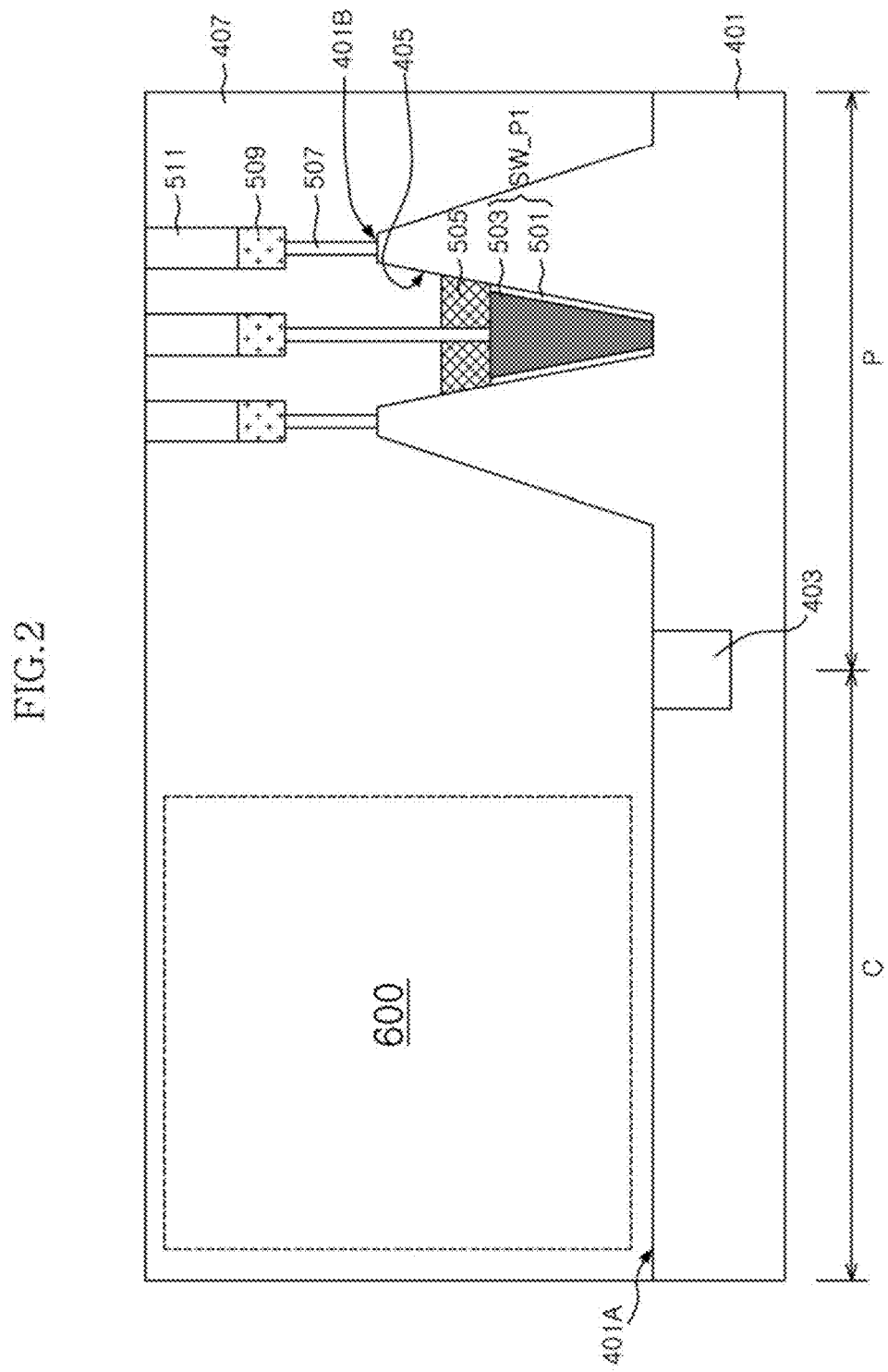
FIG. 2 is a cross-sectional view illustrating a structure of a vertical memory apparatus according to an embodiment of the present invention.

FIG. 2 is a cross-sectional view illustrating a structure of a vertical memory apparatus according to an embodiment of the present invention.

Referring to FIG. 2, a semiconductor substrate 401 that is divided into a cell area C and a peripheral area P by a device isolation layer 403 is provided.

The semiconductor substrate 401 in the cell area C is recessed to a first depth, and a memory device 600 is formed on the recessed surface 401A of the semiconductor device in the cell area C.

The semiconductor substrate 401 in the peripheral area P may protrude from the recessed surface 401A by a first height substantially the same as the first depth. A core switching device SW_P1 is formed in a portion (a recessed part) 405 in which a predetermined region of the protruding surface 401B of the semiconductor substrate 401 in the peripheral area P is recessed to a second depth. Here, the first depth is the same as or different from the second depth.

The core switching device SW_P1 may include a gate insulating layer 501 formed on a sidewall of the recessed part 405 to a predetermined height, and a gate conductive layer 503 filling the recessed part in which the gate insulating layer is formed. The gate conductive layer 503 may include a stacking structure in which a plurality of conductive layers are stacked. A height of the core switching device SW_P1 may be lower than that of the recessed part 405.

A hard mask 505 configured to protect the gate conductive layer 503 is formed on the core switching device SW_P1. Although not shown, a junction region may be formed in the semiconductor substrate 401 in an outer side of the recessed part 405 in which the core switching device SW_P1 is formed. The junction region and the core switching device SW_P1 may be coupled to an interconnection layer 509 through a junction contact 507, and the interconnection layer 509 may be coupled to each of conductive lines (not shown) through a metal contact 511.

The reference numeral 407 denotes an interlayer insulating layer.

The semiconductor memory apparatus according to an embodiment of the inventive concept forms the core switching device SW_P1 in the recessed part 405 formed in the semiconductor substrate 401 of the peripheral area P. Therefore, a substantial height of the core switching device SW_P1 may be lowered, and thus a height of the memory device 600 formed in the cell area C may be lowered.

Figure 3:
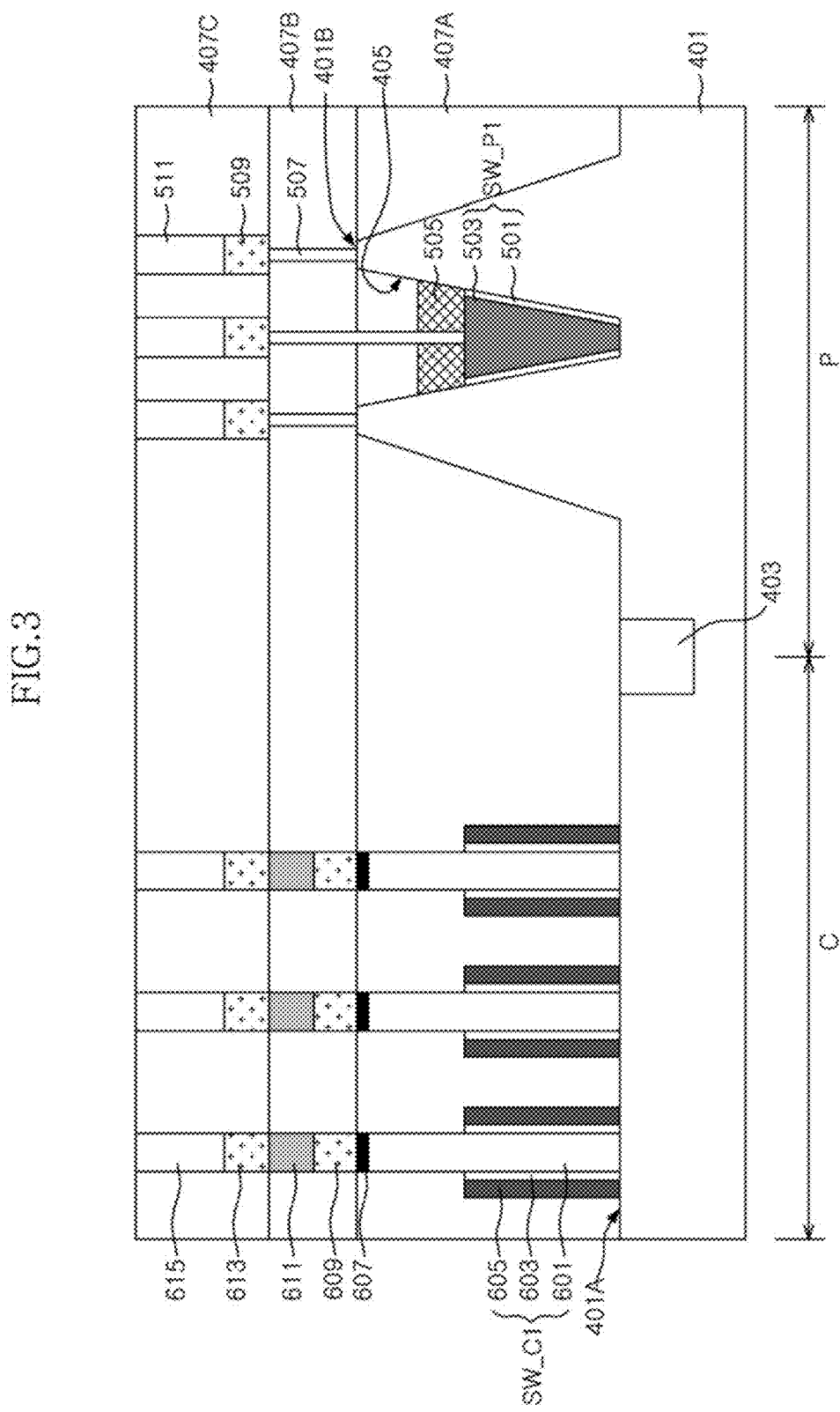
FIG. 3 is a cross-sectional view illustrating a structure of a vertical memory apparatus according to an embodiment of the present invention.

FIG. 3 is a cross-sectional view illustrating a structure of a vertical memory device according to another embodiment of the present invention.

FIG. 3 illustrates the semiconductor memory device in which a vertical memory device is formed in a cell area C.

Referring to FIG. 3, a vertical cell switching device SW_C1 is formed on a surface 401A of a semiconductor substrate 401 in the cell area C, recessed to a predetermined first depth. A lower electrode 609 and a data storage unit 611 are formed on the cell switching device SW_C1. An upper electrode 613 is formed on an upper surface of the data storage unit 611, and the upper electrode 613 may be coupled to a conductive line (not shown) through a metal contact 615. A metal silicide layer 607 may be additionally formed to improve an interface resistance between the cell switching device SW_C1 and the lower electrode 609.

A structure of the peripheral area P in FIG. 3 is the same as the structure of the peripheral area P in FIG. 2, and the reference numerals 407A, 407B, and 407C denote interlayer insulating layers.

It may be seen from FIG. 3 that a core switching device SW_P1 of the peripheral area P is formed in the recessed part 405, in a buried form. Therefore, the lower electrode 609 may be formed without being affected by a height of the core switching device SW_P1. When compared with FIG. 1, it may be seen that a height of the lower electrode 609 is considerably lowered, and thus the semiconductor memory apparatus may be miniaturized.

The cell switching device (SW_C1) may be formed in a vertical surround gate type in which a circumference of the pillar 601 is surrounded by the gate insulating layer 603 and the gate conductive layer 605, from a bottom of the pillar 601 to a predetermined height.

The data storage unit 611 may be formed using a material of which a resistance value may be switched according to a voltage or a current supplied thereto. For example, the material includes a phase-change material, a transition metal oxide, perovskite, a polymer, or the like, but the material is not limited thereto.

FIGS. 4 to 8 are cross-sectional views illustrating a method of fabricating a vertical memory apparatus according to an embodiment of to the present invention.

Figure 4:
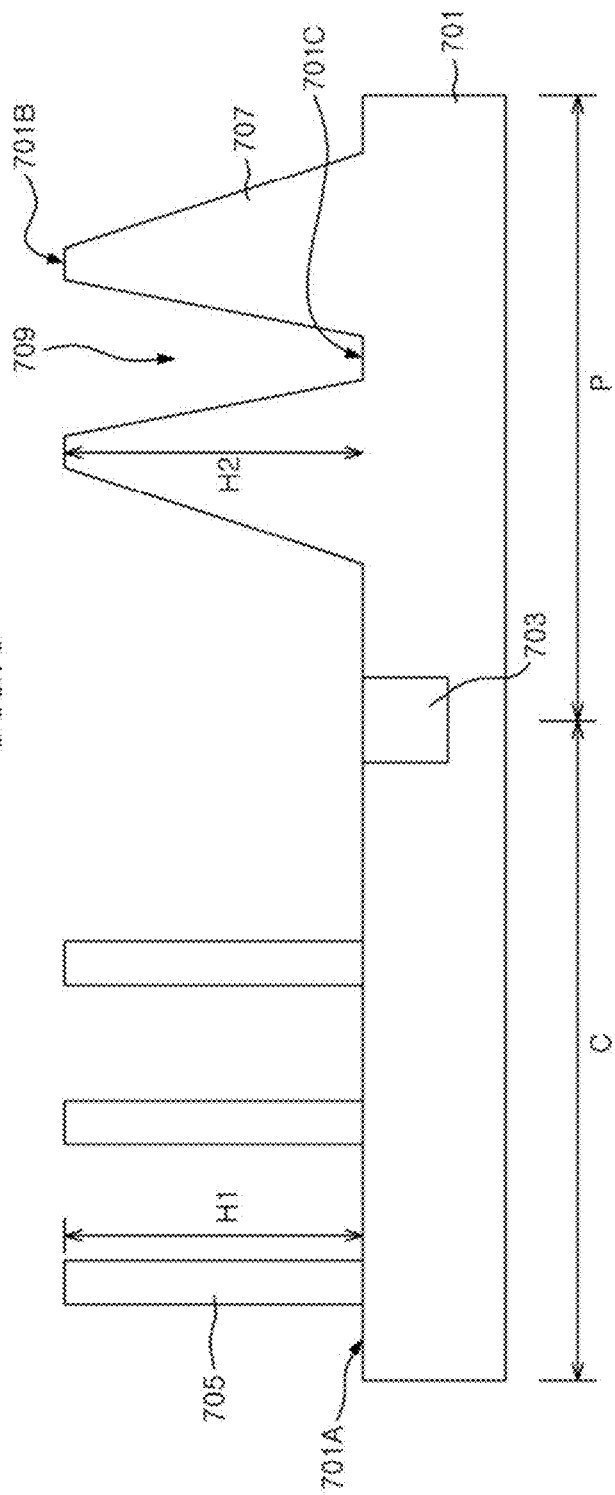
FIGS. 4 to 8 are cross-sectional views illustrating a method of fabricating a vertical memory apparatus according to an embodiment of the present invention.

As illustrated in FIG. 4, a device isolation layer 703 is formed in a semiconductor substrate 701 to define a cell area C and a peripheral area P. Predetermined portions of the semiconductor substrate in the cell area C and the peripheral area P are recessed. Thus, a pillar 705 protruding vertically from a surface 701A of the semiconductor substrate 701 in the cell area C is formed in the cell area C. A recessed part 709 is formed to a predetermined depth from a surface 701B of the semiconductor substrate in a stepped part 707 of the peripheral area P. A height from the surface 701A of the semiconductor substrate in the cell area C to an upper surface of the pillar 705 may be the same as or different from a height from a bottom 701C of the recessed part 709 to the surface 701B of the semiconductor substrate in the peripheral area P. In other words, a height H1 of the pillar 705 may be the same as or different from a height H2, which is also referred to as a depth of the recessed part 709 or a height of the stepped part 707.

The pillar 705 and the recessed part 709 may be simultaneously formed or formed through separate processes. The process order of the pillar 705 and the recessed part 709 may be changed according to a size of the device, and a degree of maturity or difficulty in the processes.

Figure 5:
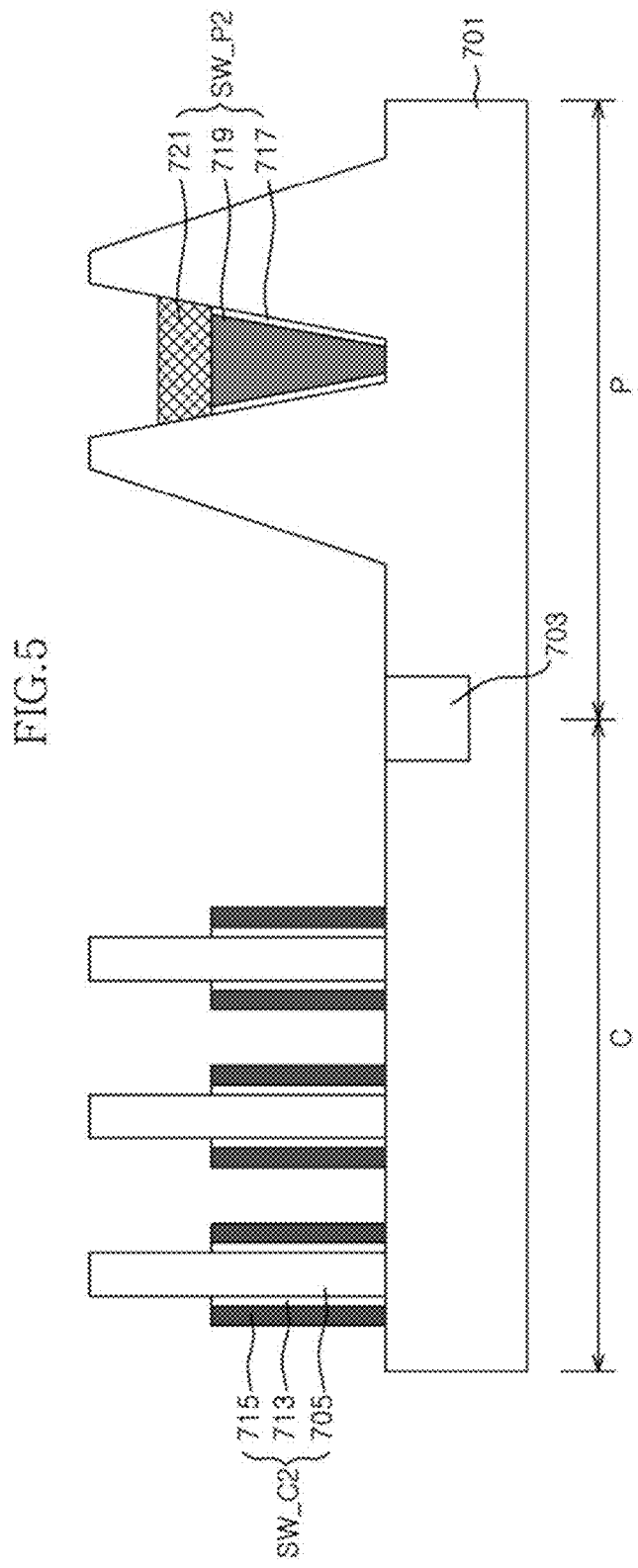

As illustrated in FIG. 5, a cell switching device SW_C2 is formed in the cell area C and a core switching device SW_P2 is formed in the peripheral area P.

To form the core switching device SW_P2, a core gate insulating layer 717 is formed on an inner sidewall of the recessed part 709 to a predetermined height, and a core gate conductive layer 719 is buried in the recessed part 709 in which the core gate insulating layer 717 is formed. A hard mask 721 may be formed on the core switching device SW_P2 in the recessed part 709.

To form the cell switching device SW_C2, a cell gate insulating layer 713 and a cell gate conductive layer 715 may be formed on an outer sidewall of the pillar 705 to a predetermined height.

The formation order of the core switching device SW_P2 and the cell switching device SW_C2 may be selected according to a size of the device, and a degree of maturity or difficulty in the processes.

The core gate conductive layer 719 and the cell gate conductive layer 715 may be formed using the same material or different materials. When the core gate conductive layer 719 and the cell gate conductive layer 715 are formed of different materials, the core gate conductive layer 719 and the cell gate conductive layer 715 may be implemented to have different characteristics. When the core gate conductive layer 719 and the cell gate conductive layer 715 are formed of the same material, the number of processes may be reduced.

Each of the core gate conductive layer 719 and the cell gate conductive layer 715 may be formed of, for example, any material selected from the group including tungsten (W), titanium (Ti), titanium silicide (TiN), silicide (WSiX), cobalt (Co), nickel (Ni), nickel platinum (NiPt) and iron (Fe). In particular, the core gate insulating layer 719 may be implemented by forming a single layer or a composite layer of the materials or by stacking at least two of the materials in a stacked form.

After the core switching device SW_P2 is formed, a junction region may be formed in the stepped part 707 in an outer side of the recessed part 709 to a predetermined depth. Similarly, after the cell switching device SW_C2 is formed, a junction region may be formed in the semiconductor substrate of an outer side of the pillar 705 and in an upper portion of the pillar 705.

Figure 6:
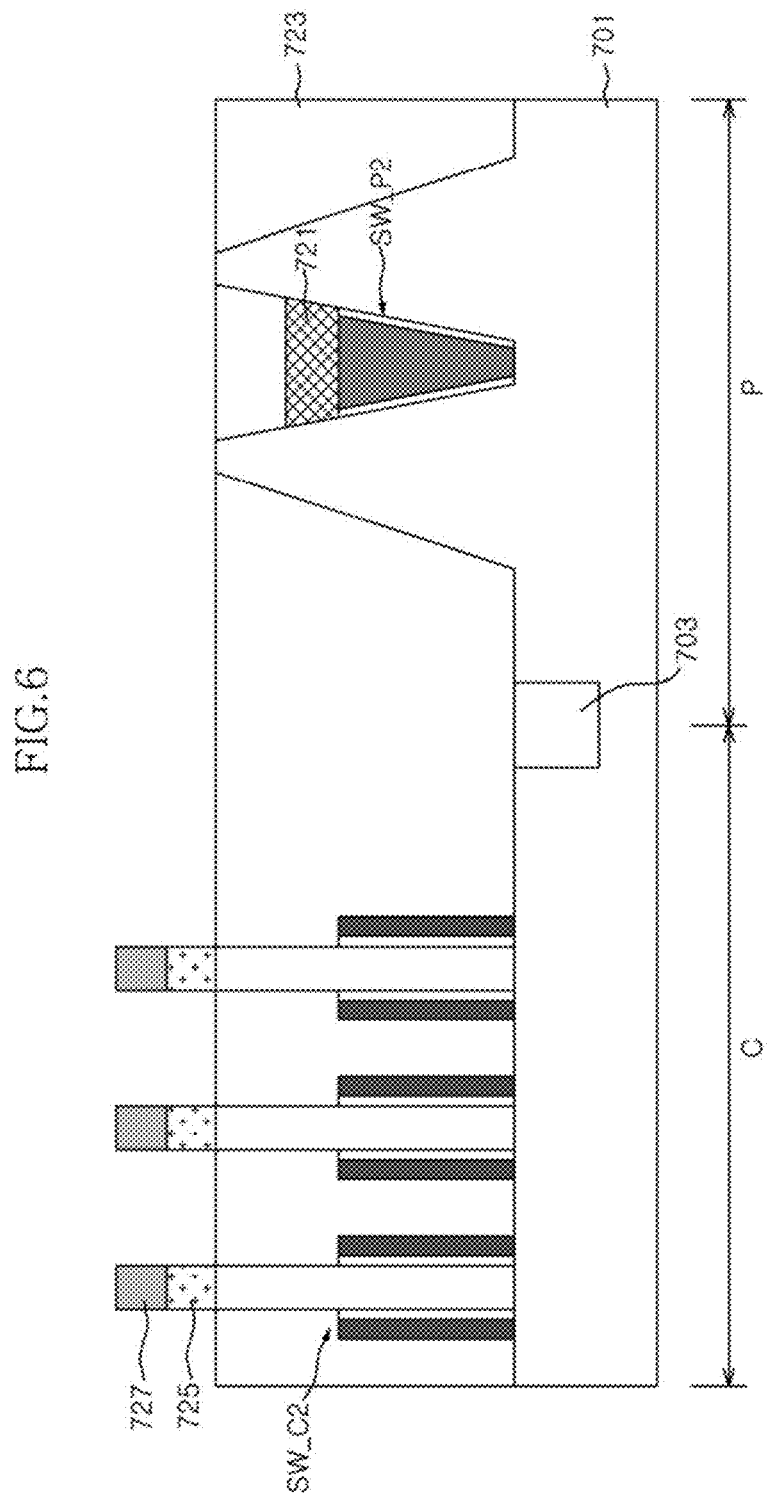

As illustrated in FIG. 6, a first interlayer insulating layer 723 is formed on the semiconductor substrate including the cell switching device SW_C2 and the core switching device SW_P2, and then planarized to expose the surface 701B of the semiconductor substrate in the peripheral area P and an upper portion of the stepped part 707. A lower electrode 725 and a data storage unit 727 are formed on a pillar in the cell area C. The data storage unit 727 may be formed using a material of which a resistance value is to be changed according to a voltage or a current supplied to the data storage unit 727. For example, the data storage unit 727 may be formed using a phase-change material, a transition metal oxide, perovskite, a polymer, or the like, but the material is not limited thereto.

Although not shown, before the lower electrode 725 is formed, a metal silicide layer may be additionally formed to improve an interface resistance between the cell switching device SW_C2 and the lower electrode 725.

Figure 7:
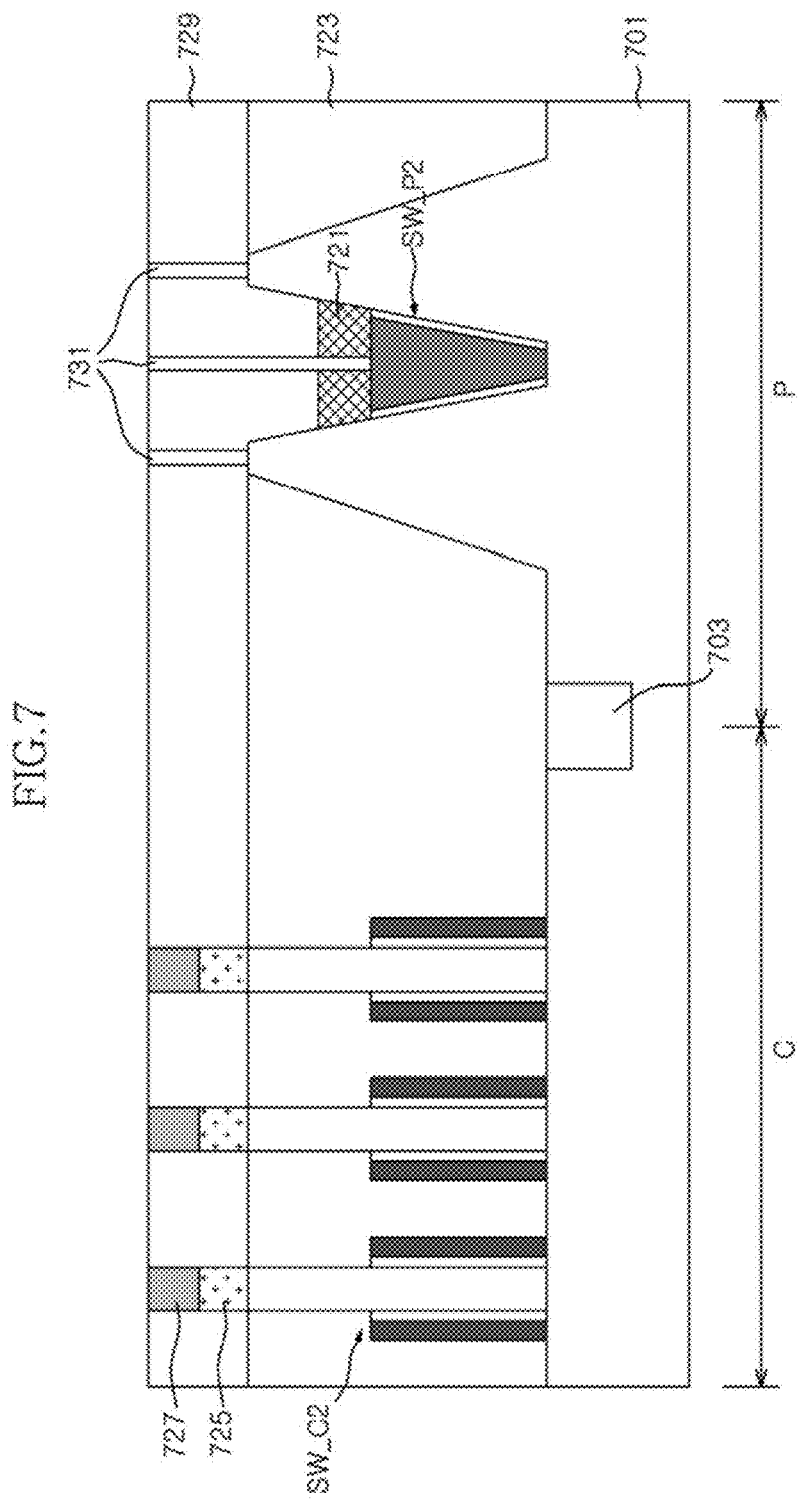

As illustrated in FIG. 7, a second interlayer insulating layer 729 is formed on the semiconductor substrate including the data storage unit 727, and then planarized to expose a top of the data storage unit 727. A junction contact 731 electrically coupled to the junction region and the gate conductive layer 719 in the peripheral area P is formed in the peripheral area P.

Figure 8:
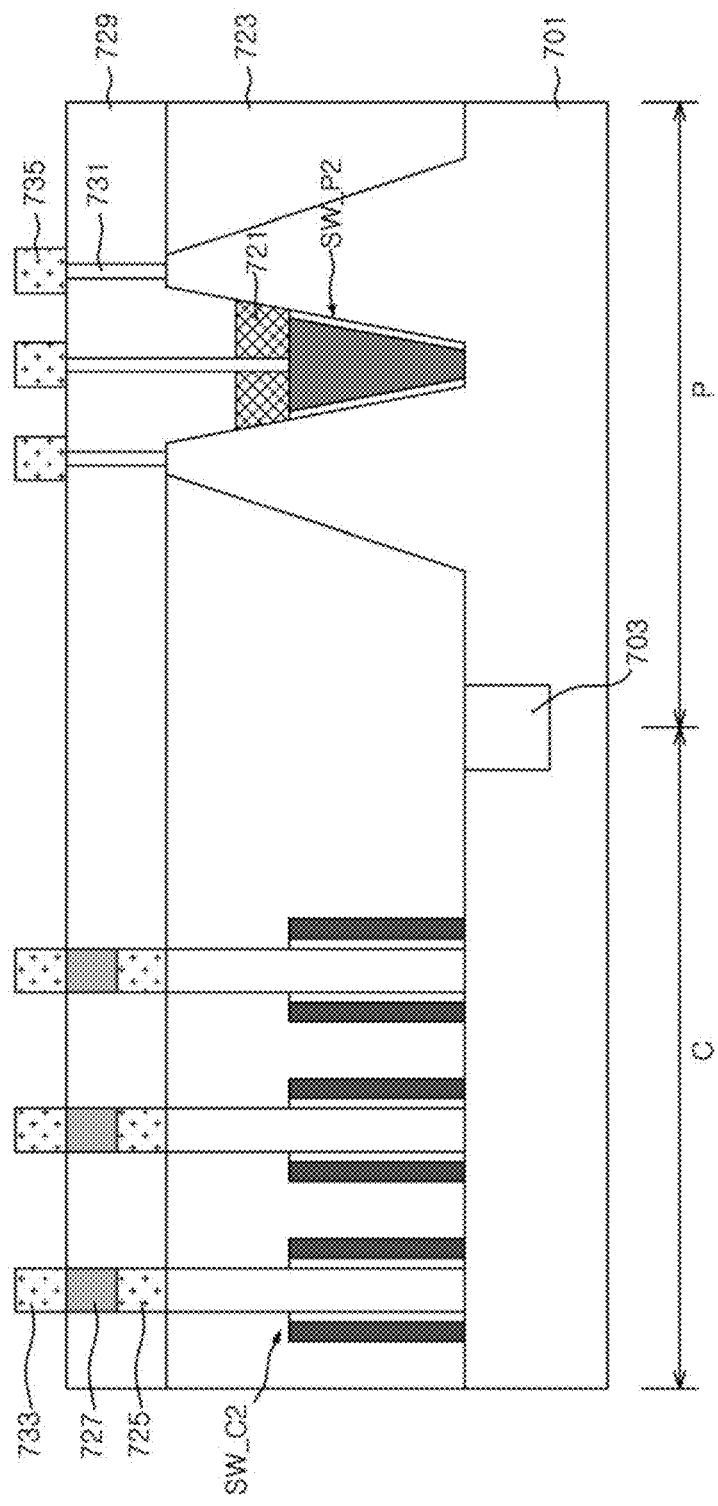

As illustrated in FIG. 8, an upper electrode 733 is formed on the data storage unit 727 of the cell area C, and an interconnection layer 737 is formed on the junction contact of the peripheral area P.

The upper electrode 733 may be coupled to a conductive line (not shown) through a metal contact (not shown) formed thereon through a subsequent process. Further, the interconnection layer 735 may be coupled to each of conductive lines (not shown) through a metal contact (not shown) formed thereon.

In this way, the recessed part 709 is formed in the stepped part 707 of the peripheral area, and the core switching device SW_P2 is formed in the recessed part 709. Since the substantial height of the core switching device SW_P2 formed in the bottom 701C of the recessed part 709 of the semiconductor substrate may be reduced, the height of the memory device formed in the cell area C, specifically, the height of the lower electrode 725, may be reduced. Accordingly, a degree of difficulty in a process for formation of the lower electrode 725 may be reduced, and an area occupied with the peripheral area P may be reduced so that high integration and miniaturization of the memory device may be further achieved.

In the memory apparatus illustrated in FIG. 1, the lower electrode 209 is formed to a height similar to that of the core switching device SW_P is formed. However, in the memory apparatus illustrated in FIG. 3 or 8, the heights of the lower electrodes 609 and 725 are determined regardless of the heights of the core switching devices SW_P1 and SW_P2, respectively. Since it is not necessary to form the lower electrodes 609 and 725 with a large height, the heights of the lower electrodes may be determined freely according to characteristics of the device to be implemented.

Accordingly, the total height of the device may be reduced, and heights in the cell area C and the peripheral area P may be substantially the same after the cell switching devices SW_C1 and SW_C2 and the core switching device SW_P1 and SW_P2 are formed. A process of depositing and planarizing the interlayer insulating layer and a process of forming the lower electrode contact hole pattern may be easily performed in a subsequent process after the cell switching devices SW_C1; and SW_C2 and the core switching device SW_P1 and SW_P2 are formed.

The example in which the vertical memory device is formed in the cell area has been described, but the inventive concept is not limited thereto. The inventive concept may be applied to a memory apparatus in which a memory device is formed after a recess is formed in the cell area C of the semiconductor substrate, a memory apparatus in which a memory device is formed in a buried type.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor memory apparatus, comprising:
    a semiconductor substrate in which a cell area and a peripheral area are defined by device isolation layer;
    a plurality of pillars formed in the cell area of the semiconductor substrate to a first depth;
    a stepped part formed in the peripheral area to a height substantially the same as the first depth;
    a recessed part formed in the stepped part to a second depth; and
    a core switching device formed in the recessed part.

2. The semiconductor memory apparatus of claim 1, wherein the first depth is the same as or different from the second depth.

3. The semiconductor memory apparatus of claim 1, further comprising:
    a cell gate insulating layer foamed to surround each of the pillars to a predetermined height; and
    a gate conductive layer formed to surround the cell gate insulating layer.

4. The semiconductor memory apparatus of claim 3, further comprising:
    a lower electrode formed on each of the pillars; and
    a data storage unit formed on the lower electrode.

5. The semiconductor memory apparatus of claim 4, wherein the data storage unit includes a material of which a resistance value is changed according to a voltage or a current supplied thereto.

6. The semiconductor memory apparatus of claim 1, wherein the data storage unit includes one selected from the group including a phase-change material, a transition metal oxide, perovskite, and a polymer.

7. The semiconductor memory apparatus of claim 1, wherein the core switching device includes a single-layered gate conductive layer or a multi-layered gate conductive layer.

8. A semiconductor memory apparatus, comprising:
    a semiconductor substrate in which a cell area and a peripheral area are defined by device isolation layer;
    a plurality of pillars having a first depth formed in the cell area of the semiconductor substrate;
    a recessed part having a second depth formed in the peripheral area of the semiconductor substrate; and
    a core switching device formed in the recessed part.

9. The semiconductor memory apparatus of claim 8, further comprising a stepped part having a height substantially the same as the first depth, formed in the peripheral area, wherein the recessed part is formed in the stepped part.

10. The semiconductor memory apparatus of claim 1, wherein the first depth is the same as or different from the second depth.

* * * * *